United States Patent
Yokoyama

(10) Patent No.: US 9,326,389 B2
(45) Date of Patent: Apr. 26, 2016

(54) WIRING BOARD AND METHOD OF MANUFACTURING THE SAME

(71) Applicant: KYOCERA Circuit Solutions, Inc., Yasu-shi, Shiga (JP)

(72) Inventor: Mitsuzo Yokoyama, Omihachiman (JP)

(73) Assignee: KYOCERA CIRCUIT SOLUTIONS, INC., Kyoto (JP)

( * ) Notice: Subject to any disclaimer, the term of this patent is extended or adjusted under 35 U.S.C. 154(b) by 75 days.

(21) Appl. No.: 14/518,082

(22) Filed: Oct. 20, 2014

(65) Prior Publication Data

US 2015/0116967 A1    Apr. 30, 2015

(30) Foreign Application Priority Data

Oct. 30, 2013 (JP) ................. 2013-225186

(51) Int. Cl.

| H05K 7/10 | (2006.01) |
|---|---|
| H05K 3/34 | (2006.01) |
| H05K 3/40 | (2006.01) |
| H05K 1/11 | (2006.01) |
| H05K 3/46 | (2006.01) |

(52) U.S. Cl.
CPC .... *H05K 3/3452* (2013.01); *H01L 2224/16225* (2013.01); *H01L 2924/15174* (2013.01); *H05K 1/113* (2013.01); *H05K 3/3436* (2013.01); *H05K 3/4007* (2013.01); *H05K 3/4644* (2013.01); *H05K 2201/0191* (2013.01); *H05K 2201/09972* (2013.01); *Y10T 29/49124* (2015.01)

(58) Field of Classification Search
USPC .......................... 361/767, 752, 808; 174/557
See application file for complete search history.

(56) References Cited

U.S. PATENT DOCUMENTS

| 2003/0043558 A1* | 3/2003 | Shirasaki | ............... H01L 23/66 361/767 |
| 2009/0229872 A1* | 9/2009 | Takaike | ............... H01L 23/498 174/261 |

FOREIGN PATENT DOCUMENTS

JP    2012-054295 A    3/2012

\* cited by examiner

*Primary Examiner* — Andargie M Aychillhum
(74) *Attorney, Agent, or Firm* — Volpe and Koenig, P.C.

(57) ABSTRACT

Provided is a wiring board including: an insulating board having a mounting portion configured such that a semiconductor element is mounted on an upper surface thereof; a semiconductor element connection pad formed on the mounting portion; a conductor pillar formed on the semiconductor element connection pad; and a solder resist layer adhered on the insulating board. The solder resist layer has a first region with a thickness such that the semiconductor element connection pad and a lower end portion of the conductor pillar are embedded while an upper end portion of the conductor pillar protrudes, and a second region having a thickness larger than that of the first region and surrounding the first region.

4 Claims, 9 Drawing Sheets

US 9,326,389 B2

WIRING BOARD AND METHOD OF MANUFACTURING THE SAME

BACKGROUND OF THE INVENTION

1. Field of the Invention

The present invention relates to a wiring board and a method of manufacturing the same. The invention particularly relates to, for example, a wiring board suitable for mounting a semiconductor element by flip chip connection and a method of manufacturing such wiring board.

2. Description of Related Art

A semiconductor element of so-called "area array" type has been known as a type of semiconductor element used as a semiconductor integrated circuit element and the like. Such area-array-type semiconductor element has, substantially on the entire lower surface thereof, a number of electrode terminals arranged in a grid-like array.

As a method of mounting an area-array-type semiconductor element on a wiring board, flip chip connection is applied. A wiring board used for flip chip connection has, on the upper surface thereof, a number of semiconductor element connection pads. The semiconductor element connection pads are terminals to be connected with electrode terminals of a semiconductor element, and are arranged in an array corresponding to an array of the electrode terminals of the semiconductor element. In flip chip connection, each semiconductor element connection pad placed on the upper surface of the wiring board and each corresponding electrode terminal placed on the lower surface of the semiconductor element are faced to each other so as to be connected electrically and mechanically with each other by soldering. Further, a gap between the semiconductor element mounted on the wiring board and the wiring board is filled with a sealing resin called an underfill, in order to seal the semiconductor element.

Recently, there has been applied a method in which a columnar conductor pillar is formed on the upper surface of a semiconductor element connection pad on a wiring board, and the conductor pillar and an electrode terminal of a semiconductor element are connected with each other (JP 2012-54295 A). Here, a conventional wiring board provided with such conductor pillar is described based on FIG. 5. As shown in FIG. 5, in a conventional wiring board 100, an insulating board 101 has, on the upper surface thereof, a mounting portion 101A on which a semiconductor element S is mounted. On the mounting portion 101A, there are disposed a plurality of semiconductor element connection pads 110, and conductor pillars 112 having individually a protrusion 112a.

The insulating board 101 has a laminated structure in which an insulating plate 102 to form a core layer is overlaid, on each of the upper and lower surfaces thereof, with a plurality of insulating resin layers 103 to form buildup layers. A plurality of through-holes 107 is formed between the upper and lower surfaces of the insulating plate 102. On the upper and lower surfaces of the insulating plate 102 and on inside walls of the through-holes 107, there is adhesively formed a wiring conductor 104 for the core layer. In each of the insulating resin layers 103, a plurality of via holes 109 is formed. On a surface of each of the insulating resin layers 103 and inside of the via holes 109, there are adhesively formed a wiring conductor 105 for the buildup layers. A part of the wiring conductor 105 forms the semiconductor element connection pads 110 on the upper surface of the insulating board 101. Another part of the wiring conductor 105 forms external connection pads 111 on the lower surface of the insulating board 101. On each of the semiconductor element connection pads 110, the conductor pillar 112 is formed. The conductor pillar 112 has, on the upper end of the columnar base portion thereof, the protrusion 112a with a small diameter. Moreover, on each of the upper and lower surfaces of the insulating board 101, a solder resist layer 106 is adhesively formed. The solder resist layer 106 on the upper surface side is adhered in such a manner that the semiconductor element connection pads 110 and the base portions of the conductor pillars 112 are embedded while the protrusions 112a protrude by 5 to 20 μm. The solder resist layer 106 on the lower surface side is adhered so as to have openings 106a to expose the external connection pads 111.

Further, as shown in FIG. 6A, electrode terminals T of the semiconductor element S and top end surfaces of the conductor pillars 112 are faced and connected with each other. Then, as shown in FIG. 6B, a gap between the semiconductor element S and the solder resist layer 106 on the upper surface side is filled with an underfill F, so that the semiconductor element S is mounted on the wiring board 100.

A description is provided below, based on FIGS. 7A to 7F, in regard to a method of forming the conductor pillar 112 in the above conventional wiring board 100.

First, as shown in FIG. 7A, the solder resist layer 106 is adhered on the upper surface of the uppermost insulating resin layer 103 on which the semiconductor element connection pad 110 is formed. The solder resist layer 106 covers an outer peripheral part of the semiconductor element connection pad 110, while having an opening 106a to expose a central part of the upper surface of the semiconductor element connection pad 110.

Next, as shown in FIG. 7B, a base metal layer 121 is adhered on the surface of the solder resist layer 106 and on an exposed upper surface of the semiconductor element connection pad 110. The exposed upper surface is in the opening 106a.

Next, as shown in FIG. 7C, a plating mask 122 is formed on the base metal layer 121. The plating mask 122 has an opening 122a above the opening 106a of the solder resist layer 106. The diameter of the opening 122a is smaller than that of the opening 106a.

Subsequently, as shown in FIG. 7D, the inside of the opening 106a of the solder resist layer 106, on which the base metal layer 121 is adhered, is filled with a plating metal to form a plating-metal layer 123. The plating-metal layer 123 is also adhered in the opening 122a of the plating mask 122, such that the plating-metal layer 123 protrudes by 5 to 20 μm from the upper surface of the solder resist layer 106.

Then, as shown in FIG. 7E, the plating mask 122 is stripped and removed. Finally, as shown in FIG. 7F, the base metal layer 121 on the solder resist layer 106 is removed by etching.

By the above method, there is formed the conductor pillar 112 which has the base portion covered with the solder resist layer 106 and has the protrusion 112a with a small diameter. The protrusion 112a is in a central part of the upper surface of the base portion, protruding upward by 5 to 20 μm from the upper surface of the solder resist layer 106.

In the above wiring board 100, the protrusion 112a with a small diameter, protruding from the solder resist layer 106, has a height of 5 to 20 μm. When the electrode terminal T of the semiconductor element S is placed on top of the protrusion 112a to be connected therewith, it is difficult to form a gap of, for example, 35 μm or more, between the semiconductor element S and the solder resist layer 106 of the upper surface side. Accordingly, it is difficult to fill the gap between the semiconductor element S and the solder resist layer 106 with the underfill F. Moreover, when the underfill F is decreased in viscosity at the time of filling or increased in filling pressure in order to improve filling performance thereof, the underfill F is prone to be extruded excessively on the solder resist layer 106 around the semiconductor element S.

In the conventional method of manufacturing the wiring board 100, increasing the height of the protrusion 112a to 35 μm or more for example, requires increasing the thickness of the plating mask 122 accordingly. However, increasing the plating mask 122 in thickness could reduce the circulation of plating solution which flows into the opening 106a through the opening 122a of the plating mask 122, when the plating-metal layer 123 is adhered in the opening 106a of the solder resist layer 106. As a result, the conductor pillar 112 could not be formed successfully.

SUMMARY OF THE INVENTION

An objective of the present invention is to provide a wiring board and a method of manufacturing the same, which facilitate filling a gap between a semiconductor element and a solder resist layer with an underfill, while preventing the underfill from being extruded excessively on the solder resist layer around the semiconductor element.

The wiring board according to the present invention includes: an insulating board having a mounting portion configured such that a semiconductor element is mounted on an upper surface thereof; a semiconductor element connection pad formed on the mounting portion; a conductor pillar formed on an upper surface of the semiconductor element connection pad; and a solder resist layer adhered on the insulating board. In the wiring board, the solder resist layer has a first region with a thickness such that the semiconductor element connection pad and a lower end portion of the conductor pillar are embedded while an upper end portion of the conductor pillar protrudes, and a second region having a thickness larger than that of the first region and surrounding the first region.

A method of manufacturing of the wiring board according to the present invention includes: a first process for forming a semiconductor element connection pad formed of a plating metal on a mounting portion of an insulating board, the insulating board having, on an upper surface thereof, the mounting portion configured such that a semiconductor element is mounted thereon; a second process for forming a conductor pillar formed of a plating metal on an upper surface of the semiconductor element connection pad; a third process for forming adhesively, on the upper surface of the insulating board, a photosensitive resin layer to form a solder resist to cover the semiconductor element connection pad and the conductor pillar; a fourth process for exposing selectively the photosensitive resin layer in such a manner that the photosensitive resin layer on the mounting portion and the vicinity thereof remains as an unexposed part, and the rest of the photosensitive resin layer is exposed to light; a fifth process for removing partially the unexposed part by developing partially the unexposed part in a direction from the upper surface side to the lower surface side, until the unexposed part obtains a thickness such that the semiconductor element connection pad and a lower end portion of the conductor pillar are embedded while an upper end portion of the conductor pillar protrudes; and a sixth process for curing the photosensitive resin layer which has been developed to obtain a solder resist layer.

In the wiring board according to the present invention, the solder resist layer on the upper surface of the insulating board has a first region with a thickness such that an upper end portion of the conductor pillar protrudes from an upper surface of the solder resist layer by 35 μm or more for example, and a second region having a thickness larger than that of the first region and surrounding the first region. With this configuration, when electrode terminals of the semiconductor element are placed on top of the conductor pillars to be connected therewith, a gap of 35 μm or more is surely formed between the semiconductor element and the solder resist layer. Accordingly, the gap between the semiconductor element and the solder resist layer is easily filled with the underfill. Moreover, even when the underfill is decreased in viscosity at the time of filling or increased in filling pressure, the inner periphery of the second region effectively prevents the underfill from being extruded excessively on the solder resist layer around the semiconductor integrated circuit element.

In the method of manufacturing the wiring board according to the present invention, after forming the conductor pillars on the semiconductor element connection pads on the insulating board, the photosensitive resin layer to form the solder resist is adhered on the insulating board. The solder resist covers the semiconductor element connection pads and the conductor pillars. Next, the photosensitive resin layer is exposed in such a manner that the photosensitive resin layer on the mounting portion and the vicinity thereof remains as an unexposed part, and the rest of the photosensitive resin layer is exposed to light. Then, the unexposed part is partially developed in a direction from the upper surface side to the lower surface side so as to be partially removed, until the unexposed part obtains a thickness such that the semiconductor element connection pads and lower end portions of the conductor pillars are embedded while upper end portions of the conductor pillars protrude. Finally, the photosensitive resin layer which has been developed is cured to obtain the solder resist layer. By this method, it is possible to form a solder resist layer having a first region with a thickness such that an upper end portion of the conductor pillar protrudes from an upper surface of the solder resist layer by 35 μm or more for example, and a second region having a thickness larger than that of the first region and surrounding the first region. Accordingly, a gap between the semiconductor element and the solder resist layer is easily filled with the underfill. Furthermore, it is possible to provide a wiring board which is able to prevent the underfill from being extruded excessively on the solder resist layer around the semiconductor integrated circuit element, even when the underfill is decreased in viscosity at the time of filling or increased in filling pressure.

DESCRIPTION OF THE PREFERRED EMBODIMENTS

Figure 1:
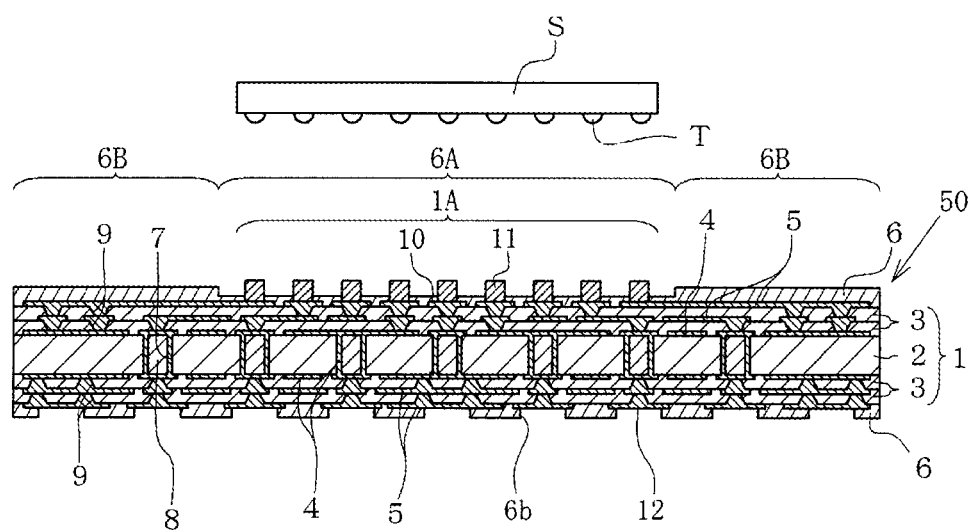
FIG. 1 is a schematic sectional view showing a wiring board according to an embodiment of the present invention.

The following is a description of a wiring board and a manufacturing method therefor according to the present invention, with reference to drawings attached hereto. A wiring board 50 shown in FIG. 1 is a wiring board according to an embodiment of the present invention. An area-array-type semiconductor element S is mounted on the wiring board 50 by flip chip connection.

As shown in FIG. 1, the wiring board 50 has a mounting portion 1A on an upper surface of an insulating board 1. The semiconductor element S is mounted on the mounting portion 1A. On the mounting portion 1A, there are formed a number of semiconductor element connection pads 10. In a central part of an upper surface of each of the semiconductor element connection pads 10, there is formed a columnar conductor pillar 11. The conductor pillars 11 are arranged in an array corresponding to an array of electrode terminals T of the semiconductor element S. A lower surface of the insulating board 1 is an external connection surface to be connected with an external electric circuit board. A solder resist layer 6 is adhered on each of the upper and lower surfaces of the insulating board 1.

The insulating board 1 has a laminated structure in which an insulating plate 2 to form a core layer is overlaid, on each of the upper and lower surfaces thereof, with a plurality of insulating resin layers 3 to form buildup layers. The insulating plate 2 has a thickness of approximately 200 to 800 µm. The insulating plate 2 is formed of an electrical insulation material. The electrical insulation material is formed by, for example, impregnating glass cloth woven from glass fiber bundles crossing in lengthwise and widthwise directions with a thermosetting resin such as a bismaleimide triazine resin or an epoxy resin. A plurality of through-holes 7 is formed between an upper surface and a lower surface of the insulating plate 2. The through-holes 7 have a diameter of approximately 50 to 200 µm. The through-holes 7 are formed by drill machining or laser processing the insulating plate 2. On the upper and lower surfaces of the insulating plate 2 and on inside walls of the through-holes 7, there is adhesively formed a wiring conductor 4 for the core layer. The wiring conductor 4 on the upper and lower surfaces of the insulating plate 2 is formed of metal foil such as copper foil and a plating metal such as copper plating coating the metal foil. The wiring conductor 4 which is inside the through-holes 7 is formed of a plating metal such as copper plating. The wiring conductor 4 has a thickness of approximately 10 to 30 µm. The wiring conductor 4 is formed by a known subtractive method. The through-holes 7, inside which the wiring conductor 4 is adhered, are filled with burying resin 8. The burying resin 8 is formed of, for example, a thermosetting resin such as an epoxy resin.

The insulating resin layers 3 to form buildup layers have a thickness of approximately 20 to 50 µm, and are formed of, for example, a thermosetting resin such as an epoxy resin. In each of the insulating resin layers 3, a plurality of via holes 9 is formed. The via holes 9 have a diameter of approximately 35 to 100 µm. The via holes 9 are formed by laser processing. On a surface of each of the insulating resin layers 3 and inside the via holes 9, there is adhesively formed a wiring conductor 5 for the buildup layers. The wiring conductor 5 is formed of a plating metal such as copper plating. The wiring conductor 5 has a thickness of approximately 10 to 30 µm. The wiring conductor 5 is formed by a known semi-additive method.

In the wiring conductor 5 for the buildup layers, a part of the wiring conductor 5 which is adhered on the outermost insulating resin layer 3 on the upper surface side of the wiring board 50 forms the circular semiconductor element connection pads 10. The semiconductor element connection pads 10 have a diameter of approximately 50 to 200 µm. On the upper surface of each of the semiconductor element connection pads 10, a conductor pillar 11 is formed. The conductor pillars 11 are formed of a plating metal such as copper plating. The conductor pillars 11 have a columnar shape with a diameter smaller than that of the semiconductor element connection pad 10. The conductor pillars 11 have a diameter of approximately 30 to 150 µm, and a height of approximately 40 to 55 µm. Electrode terminals T of the semiconductor element S are connected with the upper end of the conductor pillars 11.

On the other hand, a part of the wiring conductor 5 which is adhered on the outermost insulating resin layer 3 on the lower surface side of the wiring board 50 forms a circular external connection pad 12 which is to be electrically connected with a wiring conductor of an external electric circuit board. The external connection pad 12 has a diameter of approximately 300 to 1000 µm. The external connection pad 12 is electrically connected with a wiring conductor of an external electric circuit board which is not shown.

The solder resist layer 6 adhered on each of the upper and lower surfaces of the insulating board 1 is formed of, for example, a photosensitive thermosetting resin such as an acrylic modified epoxy resin. The solder resist layer 6 on the upper surface side has two regions, i.e., a first region 6A and a second region 6B, which are different in thickness. The first region 6A includes the mounting portion 1A and the vicinity thereof. The first region 6A has a thickness such that the semiconductor element connection pad 10 and a lower end portion of the conductor pillar 11 are embedded while an upper end portion of the conductor pillar 11 protrudes from an upper surface of the solder resist layer 6 by 35 µm or more. The second region 6B includes an area around the mounting portion 1A so as to surround the first region 6A, having a thickness larger than that of the first region.

A protrusion of the conductor pillar 11 has a height of 35 µm or more from the upper surface of the solder resist layer 6, as mentioned above. The height suitably facilitates filling a gap between the semiconductor element S and the solder resist layer 6 with the underfill. Also, the protrusion of the conductor pillar 11 is desirably 70 µm or less in height.

In the first region 6A, the solder resist layer 6 on the uppermost layer of the wiring conductor 5 has a thickness of approximately 5 to 20 µm. In the second region 6B, the solder resist layer 6 on the uppermost layer of the wiring conductor 5 has a thickness of approximately 25 to 50 µm. Meanwhile, the solder resist layer 6 on the lower surface side has an opening 6a to expose a central part of the external connection pad 12. The solder resist layer 6 on the lower surface side has a thickness of approximately 10 to 50 µm on the lowermost layer of the wiring conductor 5.

Figure 2A:
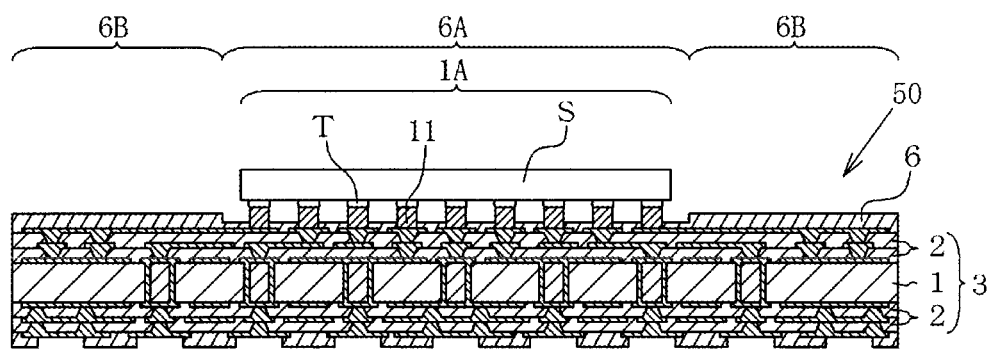
FIGS. 2A and 2B are schematic sectional views for explaining a process of mounting a semiconductor element on the wiring board shown in FIG. 1.
Figure 2B:
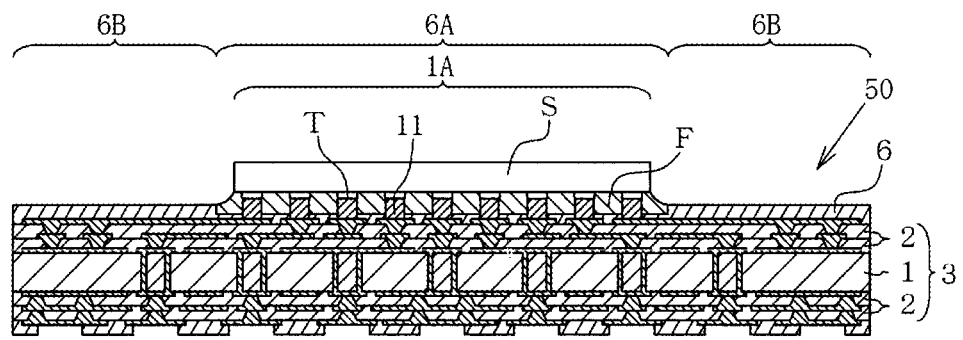

In the wiring board 50, as shown in FIG. 2A, the electrode terminals T of the semiconductor element S are connected with upper ends of the conductor pillars 11. Then, as shown in FIG. 2B, the gap between the semiconductor element S and the solder resist layer 6 on the upper surface side is filled with the underfill F. As a result, the semiconductor element S is mounted on the wiring board 50. At this time, the solder resist layer 6 on the upper surface side has, in the mounting portion 1A and the vicinity thereof, the first region 6A having a thickness such that the upper end portion of the columnar conductor pillar 11 protrudes from the upper surface of the solder resist layer 6 by 35 μm or more. The solder resist layer 6 also has, in an area around the mounting portion 1A, the second region 6B having a thickness larger than that of the first region and surrounding the first region 6A. With this configuration, when the electrode terminals T of the semiconductor element S are placed on top of the conductor pillars 11 to be connected therewith, a gap of 35 μm or more is formed between the semiconductor element S and the solder resist layer 6 on the upper surface side. This facilitates filling the gap between the semiconductor element S and the solder resist layer 6 on the upper surface side with the underfill F. In addition, even when the underfill F is decreased in viscosity at the time of filling or increased in filling pressure, the inner periphery of the second region 6B effectively prevents the underfill F from being extruded excessively on the solder resist layer 6 around the semiconductor element S.

As described above, the first region 6A includes the mounting portion 1A and the vicinity thereof. The vicinity of the mounting portion 1A is an area which facilitates filling a gap between the semiconductor element S and the solder resist layer 6 with the underfill F, or in other words, which enables filling the gap with the underfill F without being blocked by the solder resist layer 6 of the second region 6B, as well as ensures that the semiconductor element is sealed with the underfill F. Generally, the vicinity of the mounting portion 1A is an area within 1 to 3 mm from the edge of the mounting portion 1A.

In the second region 6B, the upper surface of the solder resist layer 6 is preferably lower in height than the upper end of the conductor pillar 11 by 5 to 30 μm. With this configuration, the gap between the semiconductor element S and the solder resist layer 6 on the upper surface side is easily filled with the underfill F.

Figure 3A:
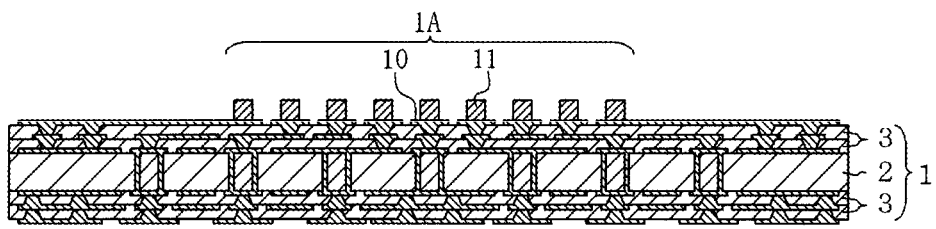
FIGS. 3A to 3E are sectional views showing a main part of the wiring board according to an embodiment of the present invention, for explaining a method of manufacturing the wiring board.

The following is a description of an embodiment of a method of manufacturing the above-described wiring board 50. First, as shown in FIG. 3A, a semiconductor element connection pad 10 formed of a wiring conductor 5 is formed on a mounting portion 1A of an insulating board 1. Also, a conductor pillar 11 is formed in a central part of an upper surface of the semiconductor element connection pad 10.

Figure 4A:
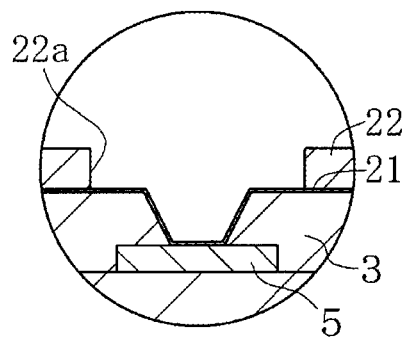
FIGS. 4A to 4F are sectional views showing a main part of the wiring board according to an embodiment of the present invention, for explaining a method of manufacturing the wiring board.

An exemplary method shown in FIGS. 4A to 4F may be applied to form the semiconductor element connection pad 10 and the conductor pillar 11. In the method, first, as shown in FIG. 4A, a base metal layer 21 is adhered on the entire surface of the uppermost insulating resin layer 3. Also, a first plating mask 22 is formed on the base metal layer 21. As the base metal layer 21, for example, electroless copper plating with a thickness of approximately 0.1 to 1 μm or the like may be used. In the first plating mask 22, there is formed a first opening 22a which corresponds to the semiconductor element connection pad 10. The first plating mask 22 described above is formed, for example, by adhesively coating the base metal layer 21 with a photosensitive dry film resist with a thickness of approximately 20 to 50 μm, then exposing and developing the dry film resist to obtain the first opening 22a.

Figure 4B:
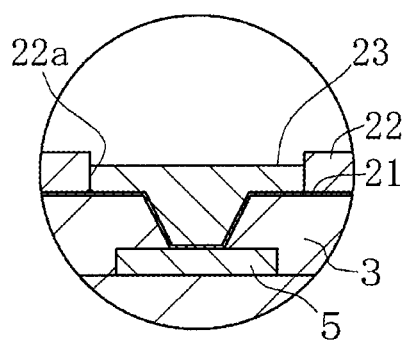

Next, as shown in FIG. 4B, a first plating-metal layer 23 to form the semiconductor element connection pad 10 is adhered on the base metal layer 21 exposed in the first opening 22a. The first plating-metal layer 23 has a thickness of approximately 10 to 30 μm. As the above first plating-metal layer 23, electrolytic copper plating is preferably used.

Figure 4C:
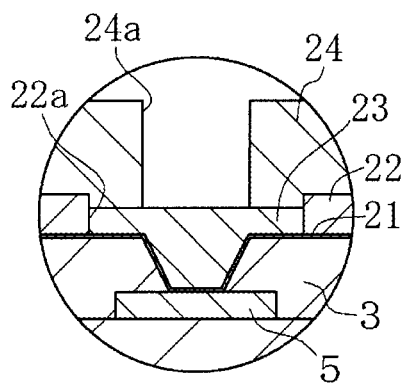

Next, as shown in FIG. 4C, a second plating mask 24 is formed on the first plating mask 22 and the first plating-metal layer 23. In the plating mask 24, a second opening 24a is formed so as to expose a central part of an upper surface of the first plating-metal layer 23 in the first opening 22a, in a size corresponding to that of the conductor pillar 11. The above plating mask 24 is formed, for example, by adhesively coating the first plating mask 22 and the first plating-metal layer 23 with a photosensitive dry film resist with a thickness of approximately 50 to 75 μm, then exposing and developing the dry film resist to obtain the second opening 24a.

Figure 4D:
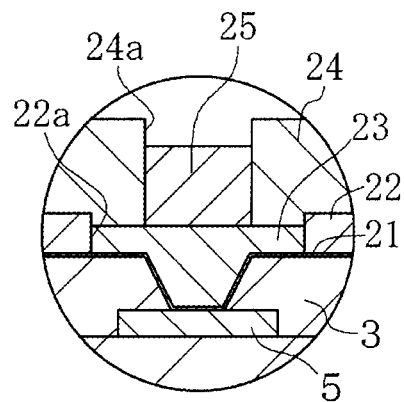

Next, as shown in FIG. 4D, a second plating-metal layer 25 to form the conductor pillar 11 is adhered on the first plating-metal layer 23 exposed in the second opening 24a. The second plating-metal layer 25 has a thickness of approximately 40 to 55 μm. As the above second plating-metal layer 25, electrolytic copper plating is preferably used.

Figure 4E:
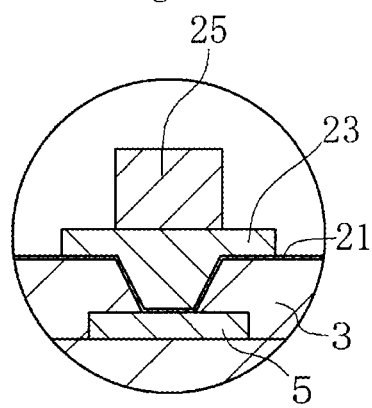

Next, as shown in FIG. 4E, the first plating mask 22 and the second plating mask 24 are stripped and removed.

Figure 4F:
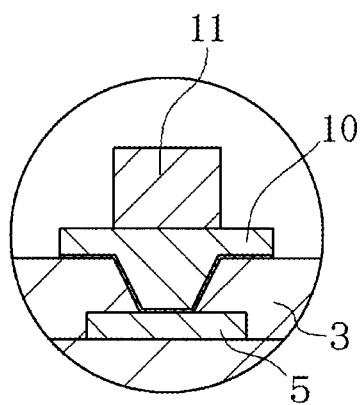
Figure 5:
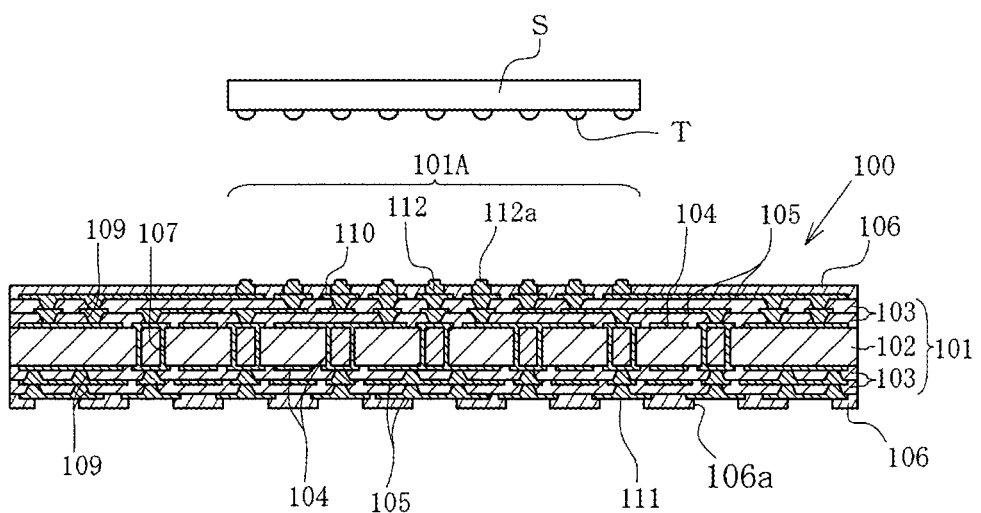
FIG. 5 is a schematic sectional view showing a conventional wiring board.
Figure 6A:
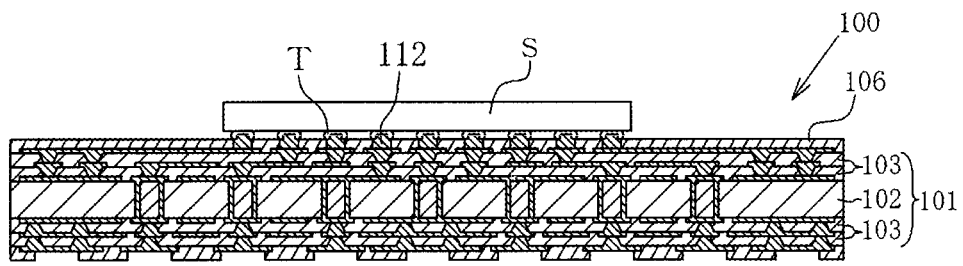
FIGS. 6A and 6B are schematic sectional views for explaining a process of mounting a semiconductor element on the wiring board shown in FIG. 5.
Figure 6B:
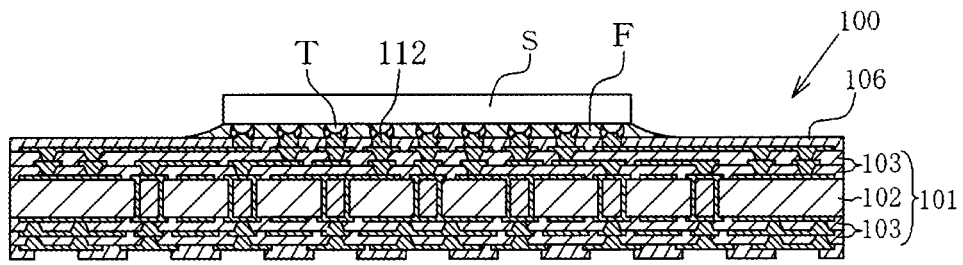
Figure 7A:
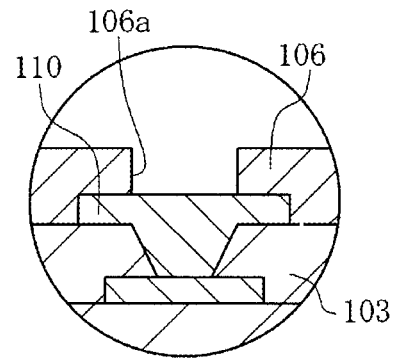
FIGS. 7A to 7F are sectional views showing a main part of the conventional wiring board, for explaining a method of manufacturing the wiring board.
Figure 7B:
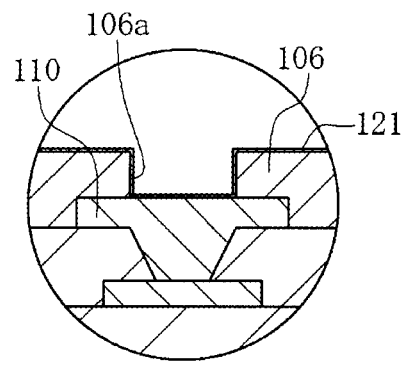
Figure 7C:
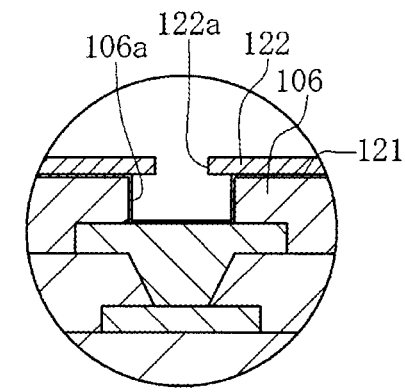
Figure 7D:
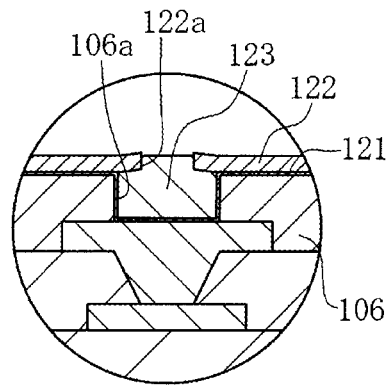
Figure 7E:
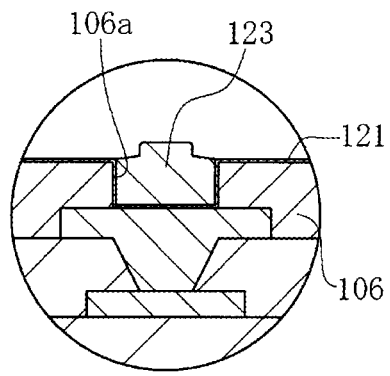
Figure 7F:
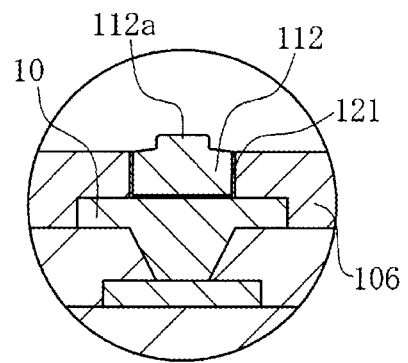

Next, as shown in FIG. 4F, the base metal layer 21 which is not covered by the first plating-metal layer 23 and exposed is removed by etching. As a result, the semiconductor element connection pad 10 formed of the first plating-metal layer 23 is formed on the upper surface of the insulating board 1, and the conductor pillar 11 formed of the second plating-metal layer 25 is formed on the semiconductor element connection pad 10.

By the foregoing procedures, there are formed the semiconductor element connection pad 10 and the conductor pillar 11.

Figure 3B:
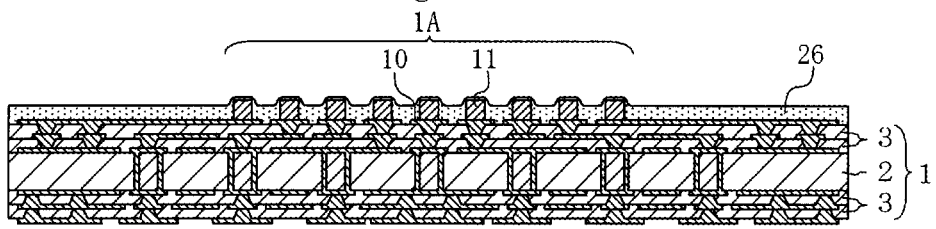

Next, as shown in FIG. 3B, a photosensitive resin layer 26 to form a solder resist layer 6 is adhered on the upper surface of the insulating board 1 on which the semiconductor element connection pad 10 and the conductor pillar 11 are formed. The photosensitive resin layer 26 is formed by applying a photosensitive resin paste to the upper surface of the insulating board 1 so as to cover the semiconductor element connection pad 10 and the conductor pillar 11, and drying the paste. The photosensitive resin layer 26 has a thickness of approximately 25 to 50 μm on the uppermost wiring conductor 5. A resin paste formed of an acrylic modified epoxy resin or the like is used as the photosensitive resin paste. A screen printing method or the like is used as a method of applying the photosensitive resin paste.

Figure 3C:
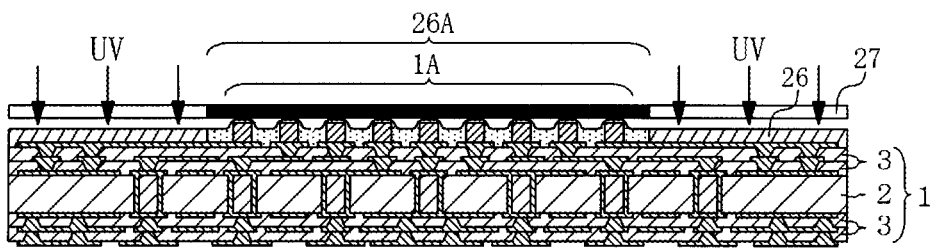

Next, as shown in FIG. 3C, an exposure mask 27 is placed above the insulating board 1. The exposure mask 27 shields from light an area corresponding to the previously mentioned first region in the wiring board 50. Then the insulating board 1 is irradiated with ultraviolet (UV) rays from above the exposure mask 27 to selectively expose the photosensitive resin layer in such a manner that the photosensitive resin layer 26 on the mounting portion 1A and the vicinity thereof remains as an unexposed part 26A, and the rest of the photosensitive resin layer 26 is exposed to the ultraviolet (UV) rays.

Figure 3D:
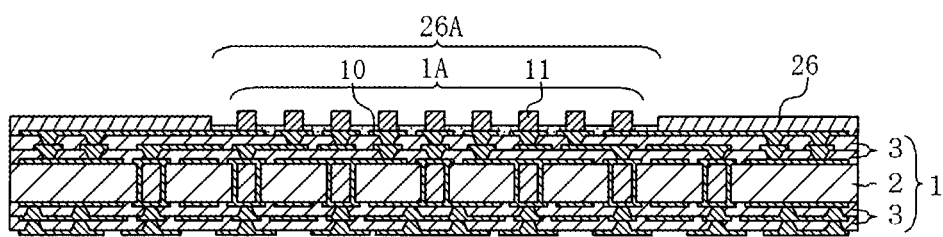

Next, as shown in FIG. 3D, the unexposed part 26A is partially removed by partially developing the unexposed part in a direction from the upper surface side to the lower surface side, until the unexposed part obtains a thickness such that the semiconductor element connection pad 10 and a lower end portion of the conductor pillar 11 are embedded while an upper end portion of the conductor pillar 11 protrudes from the upper surface of the solder resist layer 6 by 35 μm or more as described above. Meanwhile, the photosensitive resin layer 26 in an area corresponding to the previously mentioned second region 6B in the wiring board 50 maintains its original thickness. In order to partially develop and remove the unexposed part 26A, development of the unexposed part may be controlled by, for example, controlling time of the development.

Figure 3E:
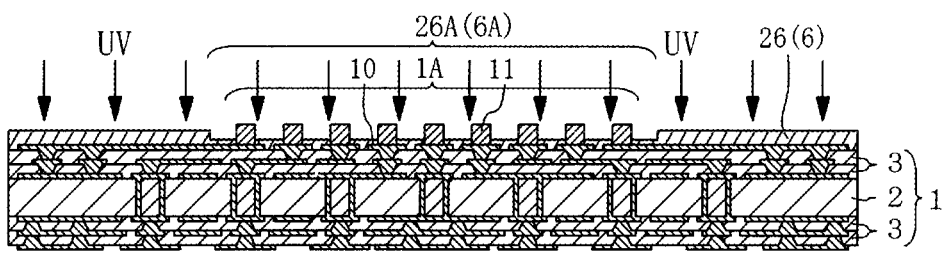

Next, as shown in FIG. 3E, the insulating board 1 is irradiated over the entire surface thereof with ultraviolet rays from the upper surface direction so that the unexposed part 26A can be exposed to light. After that, the photosensitive resin layer 26 is heat treated as necessary to be completely cured to obtain the solder resist layer 6 on the upper surface side. Finally, the solder resist layer 6 on the lower surface side is formed in an ordinary method, which completes the wiring board 50 shown in FIG. 1. Incidentally, the solder resist layer 6 on the lower surface side may be formed on the lower surface of the insulating board 1, before forming the solder resist layer 6 on the upper surface side.

As has been described heretofore, according to the above method of manufacturing the wiring board 50, it is possible to form the solder resist layer 6 including the first region 6A having a thickness such that the upper end portion of the conductor pillar 11 protrudes from the upper surface of the solder resist layer 6, and the second region 6B having a thickness larger than that of the first region 6A and surrounding the first region 6A. This configuration facilitates filling the gap between the semiconductor element S and the solder resist layer 6 with the underfill F. In addition, the method provides the wiring board 50 which effectively prevents the underfill F from being extruded excessively on the solder resist layer 6 around the semiconductor element S, even when the underfill F is decreased in viscosity at the time of filling or increased in filling pressure.

While preferred embodiments of the invention has been described, it is to be understood that changes and variations may be made without departing from the spirit or scope of the following claims.

What is claimed is:

1. A wiring board comprising: an insulating board having a mounting portion configured such that a semiconductor element is mounted on an upper surface thereof; a semiconductor element connection pad formed on the mounting portion; a conductor pillar formed on the semiconductor element connection pad; and a solder resist layer adhered on the insulating board, wherein the solder resist layer has a first region with a thickness such that the semiconductor element connection pad and a lower end portion of the conductor pillar are embedded while an upper end portion of the conductor pillar protrudes, and a second region having a thickness larger than that of the first region and surrounding the first region, wherein the semiconductor element is placed on top of the conductor pillar to be connected therewith, and a gap between the semiconductor element and the solder resist layer in the first region is filled with an under fill.

2. The wiring board according to claim 1, wherein an upper surface of the second region is lower in height than an upper end surface of the conductor pillar by 5 to 30 μm.

3. The wiring board according to claim 1, wherein the conductor pillar has a columnar shape.

4. The wiring board according to claim 1, wherein the upper end surface of the conductor pillar protrudes from an upper surface of the solder resist layer by 35 μm or more.

* * * * *